(12) United States Patent
Kim et al.

(10) Patent No.: US 12,525,372 B2
(45) Date of Patent: Jan. 13, 2026

(54) CONDUCTIVE PARTICLE, CONDUCTIVE MATERIAL, AND CONNECTION STRUCTURE

(71) Applicant: DUK SAN NEOLUX CO., LTD., Ulsan (KR)

(72) Inventors: KyungHeum Kim, Ulsan (KR); ChangWan Bae, Ulsan (KR); Taegeun Kim, Ulsan (KR); HyunHa Nam, Ulsan (KR)

(73) Assignee: DUK SAN NEOLUX CO., LTD., Ulsan (KR)

( * ) Notice: Subject to any disclaimer, the term of this patent is extended or adjusted under 35 U.S.C. 154(b) by 21 days.

(21) Appl. No.: 18/701,039

(22) PCT Filed: Dec. 15, 2021

(86) PCT No.: PCT/KR2021/019086
§ 371 (c)(1),
(2) Date: Apr. 12, 2024

(87) PCT Pub. No.: WO2023/090525
PCT Pub. Date: May 25, 2023

(65) Prior Publication Data
US 2024/0347225 A1    Oct. 17, 2024

(30) Foreign Application Priority Data
Nov. 16, 2021 (KR) .................. 10-2021-0157911

(51) Int. Cl.
*H01B 1/02* (2006.01)
(52) U.S. Cl.
CPC ...................... *H01B 1/02* (2013.01)
(58) Field of Classification Search
CPC ... H01B 1/00; H01B 1/02; H01B 1/22; H01B 5/16; C08K 3/08
USPC ........................... 252/500, 512, 518
See application file for complete search history.

(56) References Cited

FOREIGN PATENT DOCUMENTS

| CN | 112309604 A | * | 2/2021 | ............... H01B 1/02 |
| JP | 2020109739 A | * | 7/2020 | ........... H01L 23/488 |
| WO | WO-2015037711 A1 | * | 3/2015 | ............. H05K 3/323 |

OTHER PUBLICATIONS

Translation of WO-2015037711-A1 (Year: 2025).*
Translation of JP-2020109739-A (Year: 2025).*
Translation of CN-112309604-A (Year: 2025).*

* cited by examiner

*Primary Examiner* — Tri V Nguyen
(74) *Attorney, Agent, or Firm* — Outlier Patent Attorneys, PLLC

(57) ABSTRACT

Proposed is a conductive particle composed of an insulating core and a conductive layer formed on the insulating core. The conductive layer contains at least two elements. A diffraction pattern obtained by analyzing the conductive layer using XRD includes at least two diffraction rings.

11 Claims, 4 Drawing Sheets

CONDUCTIVE PARTICLE, CONDUCTIVE MATERIAL, AND CONNECTION STRUCTURE

TECHNICAL FIELD

The present disclosure relates to a conductive particle having a metallic conductive layer on the surface of an insulating core. More particularly, the present disclosure relates to a conductive particle used as a primary conductor for an anisotropic conductive bonding material for connecting fine-pitch circuits. In addition, the present disclosure relates to a conductive material and a connection structure formed using the conductive particles.

BACKGROUND ART

An anisotropic conductive material is a bonding material that vertically conveys an electrical signal between electrodes arranged in a vertical direction but does not laterally convey an electrical signal between electrodes arranged in a lateral direction. The anisotropic conductive material is a bonding material used to connect numerous electrodes to a driving IC in a display device.

Conductive particles are generally used for an anisotropic conductive material in which conductive particles are mixed and dispersed with a curing agent, an adhesive, a resin binder, and other additives and are present in the form of a dispersion. Examples of the anisotropic conductive material include an anisotropic conductive film, an anisotropic conductive adhesive, an anisotropic conductive paste, an anisotropic conductive ink, and an anisotropic conductive sheet.

The anisotropic conductive material is used in a variety of applications such as a film on glass (FOG), a chip on film (COF), a chip on glass (COG), a film on board (FOG), etc.

For example, when an anisotropic conductive material is used to bond a semiconductor chip to a flexible board, the anisotropic conductive material may be disposed on the flexible board, the semiconductor chip may be stacked on the anisotropic conductive material, and the stack is heated and pressed so that the anisotropic conductive material is cured, resulting in a connection structure in which the conductive particles electrically connect the electrodes of the flexible board and the electrodes of the semiconductor chip.

When conductive particles are included in an anisotropic conductive material, the conductive particles are mixed with additives such as a curing agent, an adhesive, a resin binder, a filler, and the like for use. When conductive particles are pressed and heated to be used as a connection structure, electrical connection between upper and lower electrodes is maintained by curing and bonding of the anisotropic conductive material.

However, in conventional conductive particles, each being composed of an insulating core and a metallic conductive layer formed on the surface of the insulating core, the metal conductive layer has a multi-layered structure for improvement of conductivity. In this case, since an amorphous phase is locally formed in the conductive layer, or an interlayer boundary is present in the conductive layer, a phenomenon in which resistance increases at the interlayer boundary appears. This results in increase in connection resistance of the anisotropic conductive material using the conductive particles, leading to deterioration in reliability resistance.

DISCLOSURE

Technical Problem

It is an objective of the present disclosure to provide a conductive particle capable of solving the problems occurring in the related art, the conductive particle having a high strength and a low initial connection resistance and exhibiting a small increase in resistance while employing a single conductive layer. In addition, an anisotropic conductive material and an anisotropic connection structure that include the conductive particles are also provided.

Technical Solution

One aspect of the present disclosure is to provide a conductive particle including:
  an insulating core; and
  a conductive layer formed on the insulating core and including at least two elements,
  in which a diffraction pattern obtained by analyzing the conductive layer using XRD includes at least two diffraction rings, and an average long axis length of crystal grains of the conductive layer is in a range of 8 nm to 13 nm.

The conductive layer may contain at least one element selected from the group consisting of Ni, B, P, N, Pd, Pt, W, Au, Ag, Mo, and Co. Preferably, the radius of the innermost diffraction ring may be in a range of 4.93 (1/nm)±0.2 (1/nm).

When the conductive layer is divided into a first region adjacent to the insulating core particle, a second region adjacent to the first region, and a third region that is an outermost region and is adjacent to the second region, it is preferable that the conductive layer is a single-layered layer with no interlayer boundary between each of the first, second, and third regions.

Preferably, in the conductive layer, the content of the elements may vary from region to region.

Preferably, the conductive layer may include at least two elements selected from the group consisting of B, P, N, Pd, Pt, W, Au, Ag, Mo, and Co.

In this case, it is preferable that the conductive particle further includes a protrusion on the surface of the conductive layer, it is preferable that the conductive particle further includes an insulating layer or insulating particles on the surface of the conductive layer, and it is preferable that the outermost surface of the conductive layer is treated with a hydrophobic anti-corrosion agent.

Another aspect of the present disclosure is to provide an anisotropic conductive material including at least one of the conductive particles.

A further aspect of the present disclosure is to provide a connection structure including at least one of the conductive particles.

A yet further aspect of the disclosure is to provide an electronic device including at least one of the conductive particles.

Advantageous Effects

Conductive particles according to embodiments of the present disclosure include a conductive layer containing a plurality of elements and having a single-layer structure. The conductive layer has no interlayer boundaries and has crystallinity. Therefore, due to the crystalline structure, the conductive particles have improved electrical conductivity, reduced electric resistance, and increased hardness.

Therefore, with the use of the conductive particles according to embodiments of the present disclosure, it is possible to provide an anisotropic conductive material and an anisotropic connection structure that have a low initial electric resistance because an increase in resistance is small. In addition, the anisotropic conductive material and the anisotropic connection structure exhibit only a small increase in resistance after high-temperature/high-humidity reliability tests.

BEST MODE

Figure 1:
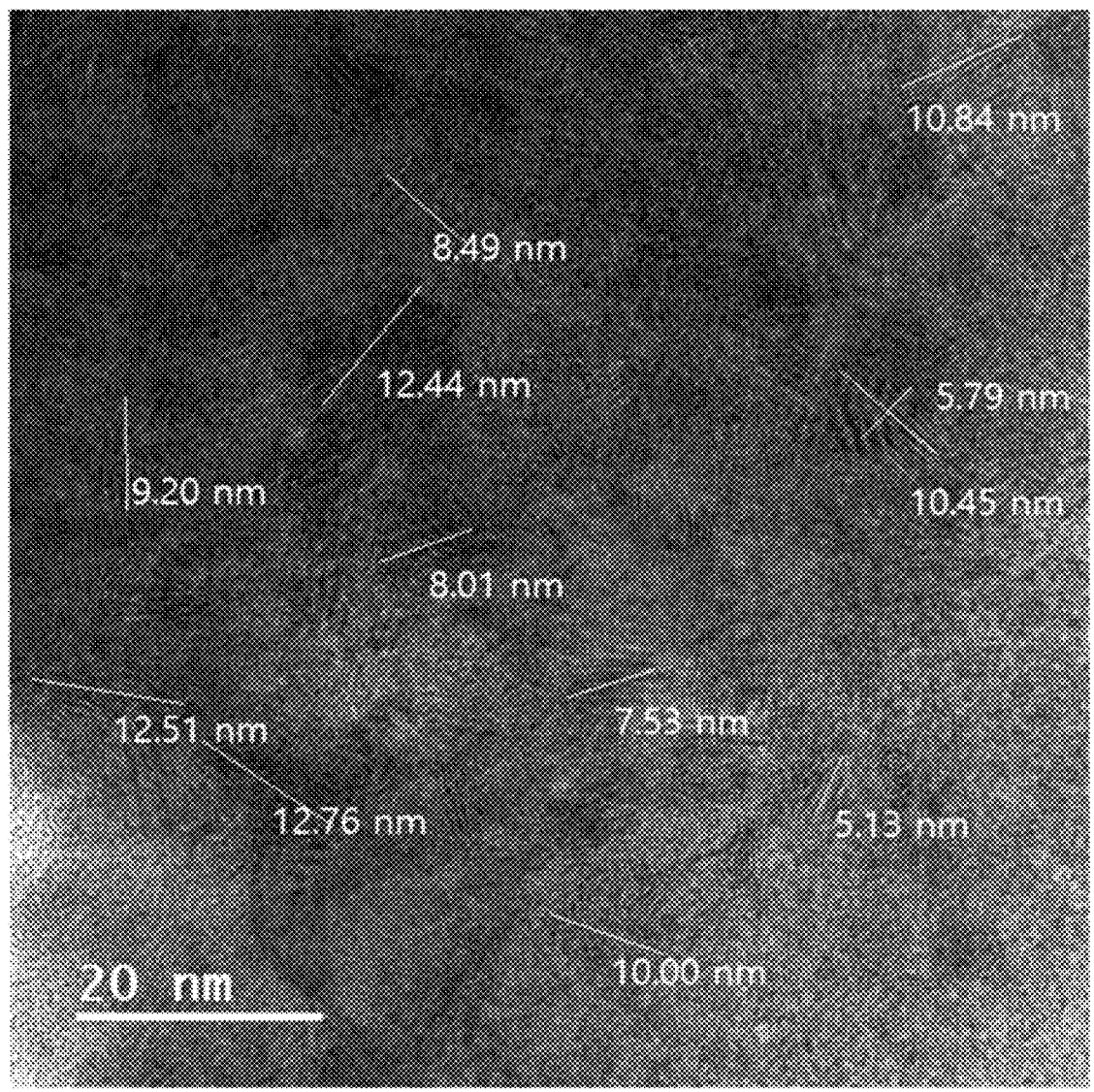
FIG. 1 is a 500,000-fold image of a conductive layer of a conductive particle according to an embodiment of the present disclosure, the image being taken with a field emission electron microscopy (FETEM) (JEM-2100F (200 kV)).

Prior to a description of the present disclosure, it should be noted that the terms used in the present specification are used only to describe specific examples and are not intended to limit the scope of the present disclosure which will be defined only by the appended claims. Unless otherwise defined herein, all terms including technical and scientific terms used herein have the same meaning as commonly understood by those who are ordinarily skilled in the art to which the present disclosure pertains.

Unless otherwise stated herein, it will be further understood that the terms "comprise", "comprises", and "comprising", when used in this specification, specify the presence of stated features, regions, integers, steps, operations, elements and/or components but do not preclude the presence or addition of one or more other features, regions, integers, steps, operations, elements, components and/or groups thereof.

All or some embodiments described herein may be selectively combined and configured so that the embodiments may be modified in various ways unless the context clearly indicates otherwise. Features that are specifically advised to be desirable or preferable may be combined with any other features that are advised to be desirable or preferable.

Conductive particles according to embodiments of the present disclosure are conductive particles that are used to electrically connect electrodes by being disposed between the electrodes. The electrodes may be oxide electrodes made of indium tin oxide (ITO), zinc oxide (ZnO), or the like. Alternatively, the electrodes may be metal electrodes made of a metal, and a powder of a metal. Further alternatively, the electrode may be a paste electrode manufactured by mixing Ag or Cu powder with resin to prepare a paste and then forming an electrode from the paste. The electrodes may include at least one of the oxide electrode, the metal electrode, and the paste electrode.

Each of the conductive particles according to embodiments of the present disclosure includes an insulating core particle and a conductive layer formed on the surface of the insulating core particle. On the surface of the conductive layer, a protrusion made of the same material as or a different material from the conductive layer may be provided.

The insulating core particles according to embodiments of the present disclosure are not particularly limited. For example, resin microparticles or oil/inorganic hybrid particulates may be used as the insulating core particles.

The resin microparticles are copolymers obtained by polymerizing urethane-based, styrene-based, acrylate-based, benzene-based, epoxy-based, amine-based, or imide-based monomers, modified monomers thereof, or mixed monomers thereof by seed polymerization, dispersion polymerization, suspension polymerization, emulsion polymerization, or the like.

When organic/inorganic hybrid particles have a core-shell structure, the shell is made of an inorganic material and the core is made of an organic material, and vice versa. The organic material is formed from the monomers, the modified monomers, or the mixed monomers. In the case of an inorganic material, oxides such as $SiO_2$, $TiO_2$, $Al_2O_3$, $ZrO_2$, etc., nitrides such as AlN, $Si_3N_4$, TiN, BaN, or carbides such as WC, TiC, SiC, etc. may be used. The shell may be formed by a chemical coating method, a sol-gel method, a spray coating method, a chemical deposition (CVD) method, a physical deposition (PVD) method, or a plating method. Alternatively, a form in which inorganic particles are dispersed in an organic matrix may be used. Further alternatively, a form in which organic particles are dispersed in an inorganic matrix. Yet further alternatively, a form in which organic particles and inorganic particles are dispersed in a ratio of 50:50 may be used.

The conductive layer of each of the conductive particles according to embodiments of the present disclosure is a conductive layer including at least two elements. Preferably, the conductive layer may include at least two elements selected from the group consisting of B, P, N, Ni, Pd, Pt, W, Au, Ag, Mo, and Co.

Preferably, the conductive layer may include Ni and at least one element selected from the group consisting of B, P, N, Pd, Pt, W, Au, Ag, Mo, and Co.

For example, the conductive layer may be made of a two-element alloy such as nickel-phosphorus, nickel-boron, nickel-tungsten, or nickel-nitrogen, or a three-element alloy such as nickel-phosphorous-tungsten, nickel-boron-tungsten, nickel-phosphorous-cobalt, nickel-phosphorous-palladium, or nickel-boron-palladium. Alternatively, the conductive layer may be made of a four-element alloy such as nickel-phosphorous-boron-tungsten, nickel-phosphorous-palladium-tungsten, nickel-boron-tungsten-platinum, or the like. The conductive layer may be made of an alloy of five or more elements.

As exemplified above, the reason that nickel is essentially included is because nickel has good electrical conductivity and good adhesion to a plastic material used as a material of the insulating core particle. For example, the insulating core particle of the conductive particle may be a polymer bead.

The conductive layer of the conductive particle according to the present embodiment is a single layer having no interlayer boundary. The content of the elements in the conductive layer may vary depending on the region of the conductive layer. However, the entire area of the conductive layer may be made of a polycrystalline material. The configuration in which the conductive layer is made of a polycrystalline material with small-size grain boundaries is advantageous in terms of electric conductivity.

Accordingly, according to one embodiment of the present disclosure, the conductive layer of the conductive particle includes two or more elements. The conductive layer of the conductive particle is a single polycrystalline layer having no interlayer boundaries and having fine grains having an average long axis of 8 to 13 nm.

In this case, when a diffraction pattern is obtained for all the regions of the conductive layer with the use of an X-ray diffractometer, multiple diffraction rings are detected. Preferably, the radius of the innermost diffraction ring among the diffraction rings is 4.93±0.2 (1/nm). On the other hand, when obtaining the XRD diffraction pattern, the radius of the diffraction ring was measured in a reciprocal lattice, and the unit of the radius was 1/nm for convenience.

The size of the aforementioned crystal grains and the radius of the innermost diffraction ring are determined by the type of elements used, the content of the elements, and a reaction rate. Therefore, since the types of elements and the contents of the elements contained in each region of the conductive layer vary from region to region, when the XRD diffraction pattern is measured for all the regions of the conductive layer, the radius of the innermost diffraction ring varies from region to region.

In the present disclosure, although the content of elements varies depending on region in the conductive layer, the conductive layer has a grain size (an average long axis length) of 8 to 13 nm in all regions, and the radius of the innermost diffraction ring among the diffraction rings of the XRD analysis diffraction pattern is within a range of 4.93 (1/nm)±0.2 (1/nm). That is, it is possible to form a single-layered conductive layer having high adhesion to the insulating core particle and having no interlayer boundaries.

For example, the conductive layer may be divided into a first region adjacent to the insulating core particle, a second region adjacent to the first region, a third region, which is the outermost region adjacent to the second region, according to the position. The conductive layer may be divided into a fourth region where the content of the elements is a first value, a fifth region where the content is a second value, and a sixth region where the content is a third value.

In this case, in the conductive layer according to one embodiment of the present disclosure, each of the first, second, third, fourth, fifth, and sixth regions satisfies the range of the average long axis length and the range of the radius of the innermost diffraction ring.

Figure 2:
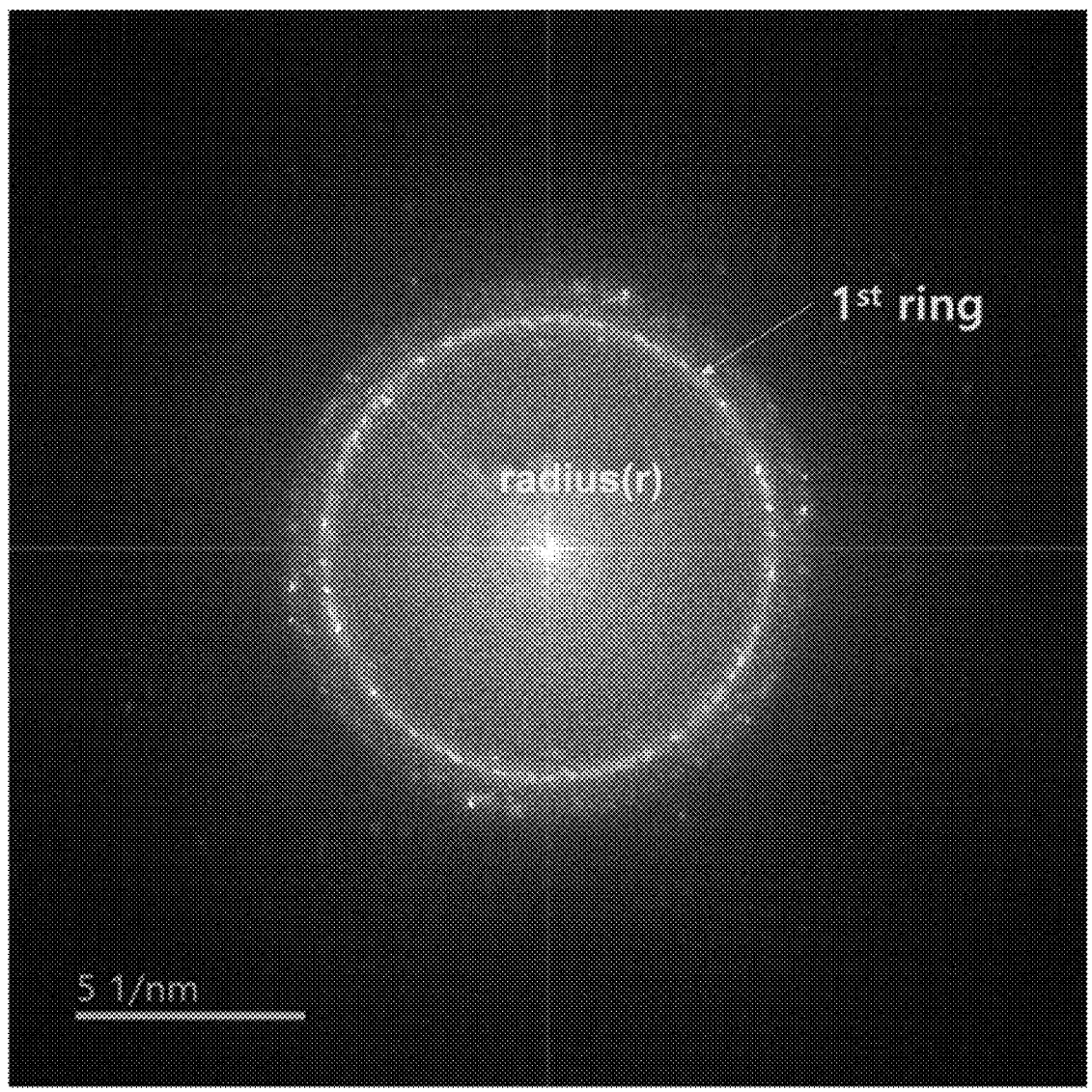
FIG. 2 is a diffraction pattern of a conductive layer of a conductive particle according to one embodiment of the present disclosure, the diffraction pattern being obtained with an X-ray diffractometer (XRD) (product name: Smart-Lab, manufacturer: RICAKU, target: Cu, electromagnetic waves used: Kα).

It is confirmed that the conductive layer according to one embodiment of the present disclosure is crystalline with grain boundaries from the 500,000-fold FETEM image of the conductive layer of the conductive particles of FIG. 1 and the diffraction pattern obtained by XRD analysis of the conductive layer of FIG. 2. That is, FIG. 2 shows that a polycrystalline conductive layer is identified.

As illustrated in FIG. 1, the boundaries of crystal grains having different directions are observed. That is, a polycrystalline conductive layer is identified. It is also confirmed that when the size of the crystal grains of the conductive particles is represented by the length of a long axis, the sizes range from 5.13 to 12.76 nm and the average size is about 9.76 nm.

FIG. 2 also shows a plurality of diffraction rings from which the crystallinity is confirmed. In this case, the radius of the innermost diffraction ring of the diffraction pattern falls within the range described above.

On the other hand, a conductive layer according to one embodiment of the present disclosure is formed as a single-layered polycrystalline layer containing two or more elements and having no interlayer boundaries, and a method of manufacturing the conductive layer is not particularly limited. For example, the conductive layer may be formed by electroless plating in which the content of elements and the reaction rate are controlled.

For example, the conductive layer may be formed by a Ni electroless plating method that may vary depending on a reducing agent used. The conductive layer may be formed by Ni—P plating using sodium phosphate, Ni—B plating using sodium borohydride (SHB), dimethyl amine borane (DMAB), or diethyl amine borane (DEAB), or Ni—N plating using hydrazine. Alternatively, with the addition of metal salts containing Pd, Pt, W, Au, Ag, Mo, and/or Co, the conductive layer may be formed of Ni—P—W, Ni—B—W, Ni—P—Co—W, Ni—B—Co—W, Ni—W, Ni—Co, Ni—Pd, or Ni—P—Pd by alloy electroless plating.

In the case of electroless plating in which Ni—P is the main component, when the content of P is high, an amorphous layer is formed. In this case, although the formed layer is highly corrosion-resistant, the layer has the disadvantages of a weak strength and a high resistance (10 μΩcm at 20° C. for P and 6.97 μΩcm at 20° C. for Ni). It is therefore advantageous that the content of P is less than 3% in terms of formation of crystal grains.

In addition, in the case of electroless plating in which Ni—B is the main component, since the resistivity of B is very high (1.5×1012 μΩcm at 20° C.), an amorphous plating layer is formed even though B is contained even in a small amount of several percentages (%). Therefore, it is preferable that the content of B is less than 0.5% in terms of formation of a crystalline layer.

In the case of electroless plating in which Ni—N is the main component, the formed Ni—N layer exhibits a weaker corrosion resistance level than Ni—P and Ni—B layers. However, when N is contained in 2% or less, a crystalline conductive layer can be formed.

Although there are cases where a conductive layer made of only Ni—P, Ni—B, or Ni—N is satisfactorily used, when a specific level of strength or corrosion resistance is required or when specific physical properties are required, alloy electroless plating additionally using one or more elements such as Pd, Pt, W, Au, Ag, Mo, and Co is used to form a single-layered crystalline plating layer.

In this case, in order to form a polycrystalline layer having no interlayer boundaries and having small grain sizes, it is necessary to control the reaction rate as well as the content of the elements added. The reaction rate is controlled by adjusting the amount of a reducing agent and the temperature and pH of a plating solution.

When the reaction rate is low, an amorphous conductive layer is formed. When the reaction rate is excessively high, the balance of the plating solution is broken, resulting in instability in plating or resulting in formation of a defective plating layer which cannot be used for production of a target product.

The shape of the protrusions of the conductive particles according to the present disclosure is not particularly limited. The protrusions may be formed in a spherical shape, a needle shape, or any polygonal shape. In the present disclosure, the size of the protrusions is not particularly limited. Preferably, the protrusions may have a convex shape having a size of 50 nm to 500 nm. More preferably, the size of the protrusions is in a range of 100 nm to 300 nm.

A method of forming the protrusions of the conductive particles according to the present disclosure is not particularly limited. For example, a catalyst may be applied to the surface of the insulating core particle, and the conductive layer and the protrusion may be formed through electroless plating. The conductive layer and the protrusions may be formed by attaching small metallic or inorganic particles to the insulating core particle and performing electroless plating on the insulating core particle.

Preferably, the outermost shell of the conductive particle may have an insulating film. As electronic products are miniaturized and more highly integrated, the pitch of the electrodes is reduced. When there are no insulating particles in the outermost shell, electric conduction may occur between electrodes that are adjacent to each other. Exemplary methods of forming an insulating film include: a method of chemically attaching insulating particles to the outermost shell of a conductive particle by using functional groups; a method of dissolving an insulating material in a solvent to prepare an insulating solution and coating a conductive particle with the insulating solution using a spraying process or a dipping process; and a method of attaching insulating particles to the outermost shell of a conductive particle and coating the particle by applying hot air or impact to the particle.

Preferably, the conductive layer of the conductive particle may undergo an anti-corrosion treatment. The anti-corrosion treatment has an effect of increasing the angle of contact with water, thereby increasing the reliability of the conductive particle in a high humidity environment and an effect of reducing the performance deterioration of a connection member by dissolving impurities in water. Therefore, preferably, an anti-corrosion agent used for the anti-corrosion treatment may exhibit hydrophobicity. The coating may be performed by dipping or spraying after dissolving an anti-corrosion agent in a solvent.

The conductive particles according to the present disclosure may be dispersed in a binder resin to prepare an anisotropic conductive material. The anisotropic conductive material may be, for example, an anisotropic conductive paste, an anisotropic conductive film, an anisotropic conductive sheet, or the like.

The resin binder is not particularly limited. Examples of the resin binder include: vinyl resins such as a styrene type, acryl type, and vinyl acetate type; polyolefin- or polyamide-based resins thermoplastic resins; and urethane- or epoxy-based curable resins. One or more resins mentioned above may be used solely or in combination. For the purpose of polymerization or curing of the resin, a radical initiator such as benzoyl peroxide (BPO) or a photoinitiator such as trimethylbenzoyl phenylphosphate (TPO), and/or an epoxy latent curing agent such as HX3941HP may be used solely or in combination. In addition, other materials may be added to the resin binder of the anisotropic conductive material in a dosage range that is not detrimental to achieving the objectives of the present disclosure. For example, colorants, softeners, thermostabilizers, photostabilizers, antioxidants, inorganic particles, and the like may be added.

A method of manufacturing the anisotropic conductive material is not particularly limited. For example, the conductive particles may be uniformly dispersed in the resin binder so as to be used for an anisotropic conductive paste. Alternatively, the conductive particles may be thinly spread on a sheet of release paper so as to be used for an anisotropic film.

The connection structure according to the present disclosure uses the insulating core particle-based conductive particles according to the present disclosure or the anisotropic conductive material according to the present disclosure to connect circuit boards to each other. For example, the connection structure may be used, in a mobile phone such as a smartphone, to connect a glass substrate on which a circuit is formed to a display semiconductor chip or to connect a μ-LED device or a mini-LED device to a circuit board.

Example 1

1) Synthesis of Insulating Core Particle

To a 3 L glass beaker, 1100 g of monomer tetramethylol methane tetraacrylate (TMMT), 400 g of DVB, 15 g of HDDA, and 30 g of styrene were added, and 5 g of BPO serving as an initiator was added. The content in the beaker was treated in a 40 kHz ultrasonic bath for 10 minutes to prepare a first solution.

In a 5 L beaker containing 3,000 g of deionized water, 500 g of polyvinylpyrrolidone (PVP)-30K and 200 g of dioctyl sulfosuccinate sodium salt serving as a surfactant (Solusol) were dissolved to prepare a second solution.

The first solution and the second solution were charged into a 50 L reactor, and 40,000 g of deionized water was added thereto. The solution was treated with an ultrasonic homogenizer (20 kHz, 600 W) for 90 minutes. The solution was heated to 35° C. while being rotated at 120 rpm and was then maintained at 35° C. for 3 hours. Afterwards, the solution was heated to 85° C. and the solution was then maintained at 85° C. for 16 hours for a polymerization reaction.

Microparticles generated through the polymerization were subjected to filtration, washing, fractionation, and drying processes to produce resin core microparticles. As the mean diameter of the prepared resin microparticles serving as core particles, a mode value measured with a particle size analyzer (BECKMAN MULTISIZER TM3) was used. In this case, the number of the core particles measured was 75,000. The mean diameter was 3.51 μm.

2) Formation of Conductive Layer as Outer Shell of Insulating Core Particle

① Catalyst Treatment Process

A cleaning and degreasing process of removing excessive unreacted monomers and grease present in the insulating core particles was performed. The process was performed by putting 30 g of the prepared insulating core particles in a solution prepared with the use of 800 g of deionized water, 0.5 g of Triton X100 serving as surfactant, and 10 g of sulfuric acid and treating the insulating core particles in an ultrasonic bath for 1 hour. At the end of the washing and degreasing process, water washing was performed three times using 45° C. deionized water.

After the degreasing and washing process was completed, sensitization was performed three times in which the insulating core particles were put into a solution prepared by dissolving 150 g of tin chloride and 300 g of 35%-37% hydrochloric acid in 600 g of deionized water, and then dipped and stirred at 30° C. for 30 minutes.

After the sensitization, the insulating core particles were put into a solution of 1 g of palladium chloride, 200 g of 35%-37% hydrochloric acid, and 600 g of deionized water, and activated at 40° C. for 1 hour. For the activation, ultrasonic waves were applied to an ultrasonic bath. After the activation processing, water washing was performed three times.

An acceleration process was performed by placing the activated insulating core particles in a solution of 100 g of 35%-37% hydrochloric acid and 600 g of deionized water and stirring the solution at room temperature for 10 minutes. After the acceleration process, water washing was performed three times to obtain catalyst-treated insulating core particles for electroless plating.

② Plating Process

A solution "a" was prepared by sequentially dissolving 70 g of nickel sulfate as a Ni salt, 5 g of sodium acetate as a complexing agent, 2 g of lactic acid, 0.001 g of Pb-acetate as a stabilizer, 0.001 g of sodium thiosulfate, and 1 g of PEG-600 as a surfactant, in this order, in 3500 g of deionized water contained in a 5 L reactor. The catalyst-treated insulating core particles were added to the prepared solution "a" and dispersion processing was performed 10 minutes using an ultrasonic homogenizer. After the dispersion processing, ammonia was added to adjust the pH of the solution 8.0. Thus, a solution "b" was obtained.

A solution "c" was prepared by dissolving 33 g of DMAB as a reducing agent and 0.002 g of sodium thiosulfate as a stabilizer in 300 g of deionized water in a 1 L beaker.

A solution "d" was prepared by dissolving 155 g of nickel sulfate and 10 g of sodium hydroxide in 500 g of deionized water in a 1 L beaker.

In a state in which the temperature of the solution "b" in the 5 L reactor is maintained at 20° C., the solution "c" was added thereto at a rate of 5 g per minute using a quantitative pump, the temperature of the reactor was raised to 35° C. at a rate of 0.33° C./min, and the temperature was maintained.

Aqueous ammonia was added to adjust the pH of the solution "b" in the 5 L reactor to 8.0 until the temperature of the solution "b" reached 35° C., and addition of aqueous ammonia was not performed after the temperature of the solution reached 75° C.

At the time at which 5 minutes elapsed after the addition of the solution "c", the solution "d" was added to the 5 L reactor in a feed rate of 20 g per minute using a quantitative pump.

After the addition of the solution "c" was completed, the state was maintained for 30 minutes to obtain Ni-plated conductive particles.

Example 2

The same processes as in Example 1 were performed, except that 3 g of potassium gold cyanide was added to solution "d".

Example 3

A solution "a" was prepared by sequentially dissolving 70 g of nickel sulfate as a Ni salt, 5 g of sodium acetate as a complexing agent, 2 g of lactic acid, 0.001 g of Pb-acetate as a stabilizer, 0.001 g of sodium thiosulfate, and 1 g of PEG-600 as a surfactant, in this order, in 2500 g of deionized water in a 5 L reactor. The catalyst-treated insulating core particles were added to the prepared solution "a" and dispersion processing was performed 10 minutes using an ultrasonic homogenizer. After the dispersion processing, ammonia was added to adjust the pH of the solution 5.5. Thus, a solution "b" was obtained.

A solution "c" was prepared by dissolving 280 g of sodium hypophosphate as a reducing agent and 0.002 g of sodium thiosulfate as a stabilizer in 500 g of deionized water in a 1 L beaker.

A solution "d" was prepared by dissolving 155 g of nickel sulfate and 5 g of sodium hydroxide in 500 g of deionized water in a 1 L beaker.

In a state in which the temperature of the solution "b" in the 5 L reactor was maintained at 65° C., the solution "c" was added thereto at a feed rate of 5 g per minute using a quantitative pump, the temperature of the reactor was raised to 75° C. at a rate of 0.33° C., and the temperature of the reactor was maintained.

Aqueous ammonia was added to adjust the pH of the solution "b" in the 5 L reactor to 5.5 until the temperature of the solution "b" reached 75° C., and addition of aqueous ammonia was not performed after the temperature of the solution reached 75° C.

At the time at which 5 minutes elapsed after the addition of the solution "c", the solution "d" was added to the 5 L reactor in a feed rate of 20 g per minute using a quantitative pump.

After the addition of the solution "c" was completed, the state was maintained for 30 minutes to obtain conductive particles having a crystalline Ni—P plating layer.

Example 4

The same processes as in Example 1 were performed, except that a solution "d" was prepared by dissolving 155 g of nickel sulfate, 10 g of hydrochloric acid, and 0.5 g of palladium chloride (PdCl2) in 500 g of deionized water.

Experimental Example

Figure 3:
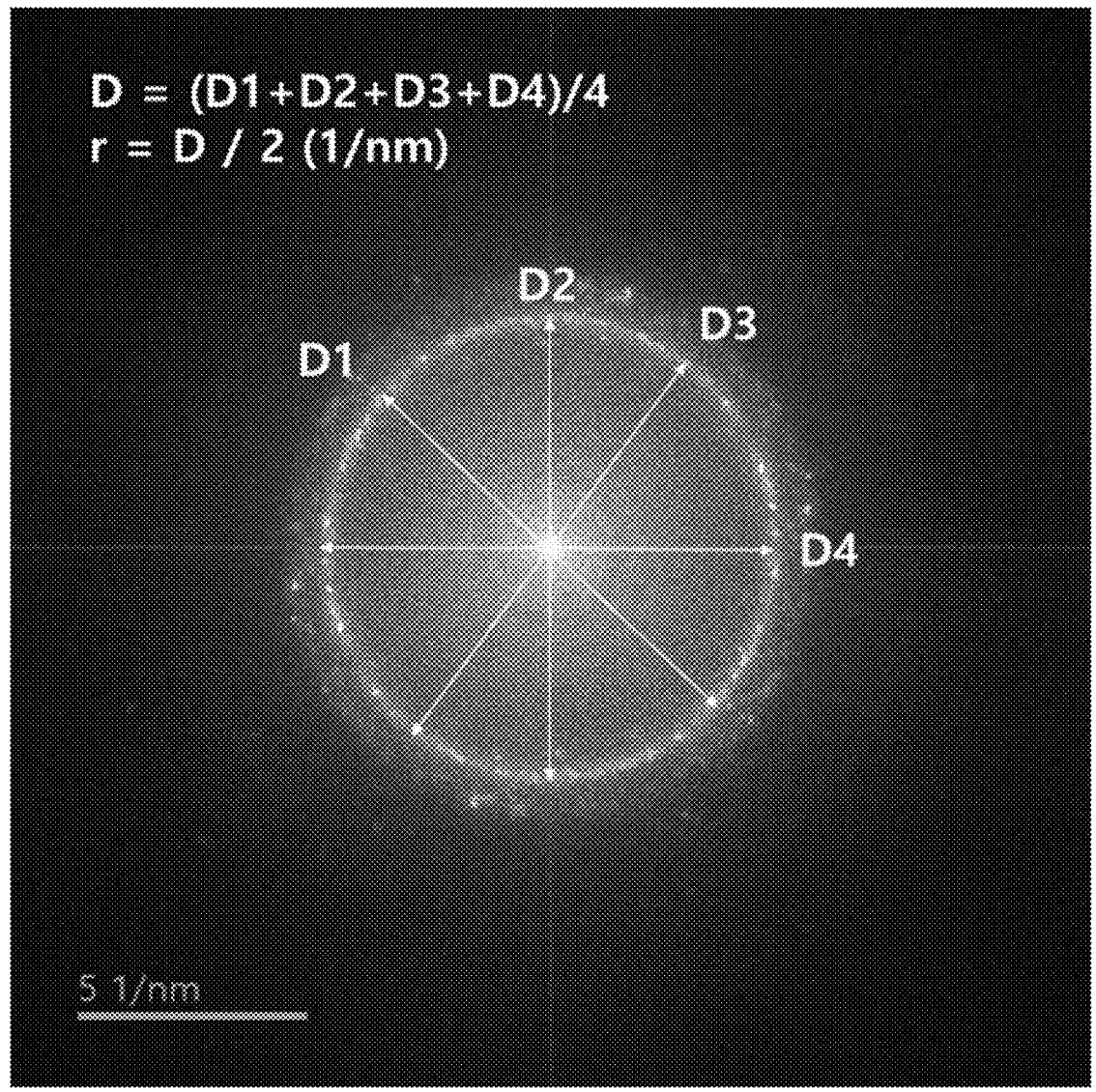
FIG. 3 is a diagram illustrating a method of obtaining the radius of a diffraction ring.
Figure 4:
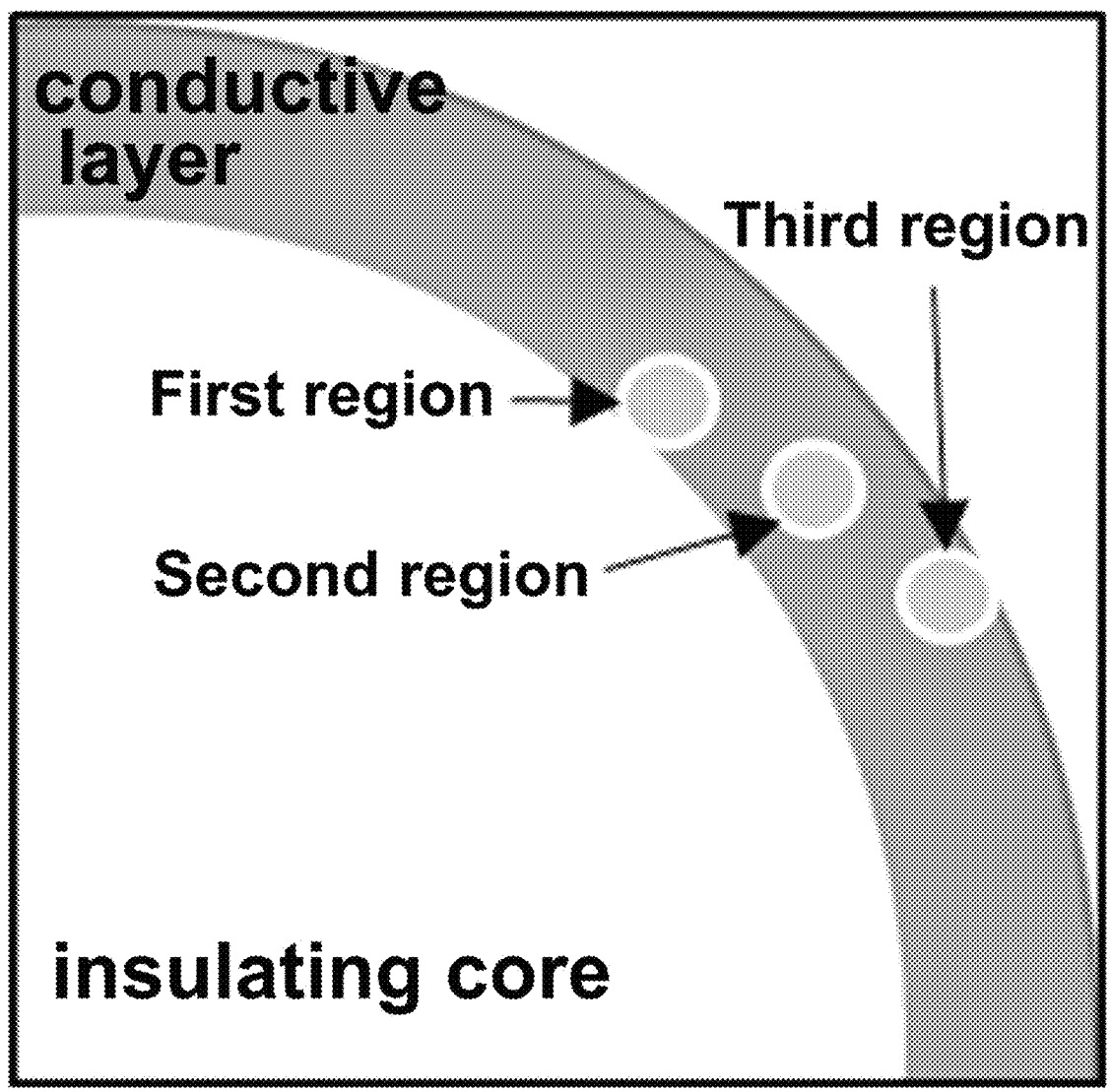
FIG. 4 is a diagram showing a position of a conductive layer in a conductive particle according to one exemplary embodiment of the present disclosure.

The conductive particles obtained in Examples 1 to 4 were evaluated.
1) Measurement of Size of Insulating Core Particle As the mean diameter of the insulating core particles, a mode value measured with a particle size analyzer (BECKMAN MULTISIZER TM3) was used. In this case, the number of the conductive particles used for the measurement was 75,000.
2) XRD Analysis The radii of first to fourth diffraction rings of a diffraction pattern obtained by X-ray diffraction (SmartLab) analysis of the conductive layer of the conductive particle using a Cu target are summarized in Table 1. In this case, the radius of each of the diffraction rings was obtained using Digital Micrograph (version 3.42.3048.0). As shown in FIG. 3, four diameters passing through the center of one diffraction ring were first obtained, the average value of the four diameters was then obtained, and the average value was divided by 2 to obtain the radius r. In addition, the measurement for the conductive layer was performed for a first region adjacent to the insulating core, a second region adjacent to the first region, and a third region adjacent to the second region and located at the outermost side.

TABLE 1

| Position | Ring | Example 1 | Example 2 | Example 3 | Example 4 |
|---|---|---|---|---|---|
| First region | First | 4.9325 | 4.8625 | 4.90875 | 5.04 |
|  | Second | 5.795 | 5.6425 | 5.6275 | 5.86625 |
|  | Third | 8.0275 | 6.83625 | 8.09875 | — |
|  | Fourth | — | 8.02625 | — | — |
| Second region | First | 4.9225 | 4.75125 | 4.9 | 4.99625 |
|  | Second | 5.76125 | 6.225 | 5.75 | 5.78 |
|  | Third | 8.03375 | — | — | — |
|  | Fourth | — | — | — | — |
| Third region | First | 4.95 | 4.75875 | 4.98 | 4.92375 |
|  | Second | 5.81 | 5.52 | — | 5.7175 |
|  | Third | 8.185 | 6.705 | — | 7.6175 |
|  | Fourth | — | 7.85125 | — | — |

3) Crystal Grain Boundary Analysis.

The length of the long axis of the crystal grain for each of Examples 1 to 3 was measured. The long axis lengths are summarized in Table 2.

TABLE 2

|  | Example 1 | Example 2 | Example 3 |
|---|---|---|---|
| Minimum | 5.13 | 5.1 | 4.84 |
| Maximum | 12.76 | 19.55 | 13.64 |
| Average | 9.76 | 12.2125 | 8.51429 |

4) Measurement of Connection Resistance

① Preparation of Anisotropic Conductive Film 2 g of HP4032D (trademark, manufactured by DIC), which is naphthalene-based epoxy resin, 20 g of YP-50 (trademark, manufactured by Toto Chemical Co., Ltd.), which is phenoxy resin, 25 g of VR-60 (trademark manufactured by Showa Denko K.K.), which is acrylic epoxy resin, 22 g of HXA-3922HP (trademark, manufactured by Asahi Kasei Corporation), which is a thermal curing agent, and 5 g of A-187 (trademark, manufactured by Momentive Performance Materials), which is an epoxy silane coupling agent were well stirred. From the mixture, a blended compound with a solid content of 50% was made using toluene as a solvent. The conductive particles were added in an amount of 10% with respect to the weight of the blended compound, and then the content was mixed with a revolution-rotation mixer for 5 minutes at a revolution speed of 400 rpm and a rotation speed of 150 rpm to produce an anisotropic conductive paste. The anisotropic conductive paste was applied on a sheet of release paper to form a 20 μm-thick film. The 20 μm-thick film was dried for 75 minutes in an atmosphere using a hot air drying furnace to produce a 12 μm-thick anisotropic conductive film.

② Electrode for Resistance Measurement

Electrodes for measuring resistance, transparent electrodes were formed by depositing indium tin oxide (ITO) on a glass substrate. Thus, a flexible printed circuit board (FPCB) was fabricated in which the width of the electrode and the glass substrate on which the electrode was formed was 20 μm and the spacing between the electrodes was 50 μm.

③ Bonding

The anisotropic conductive film was cut into pieces with a width of 3 mm. With the use of a joining jig having a width of 1 mm and a length of 30 mm, the anisotropic conductive film was pressed against a glass substrate having an ITO electrode thereon under conditions of 0.2 MPa, 120° C., and 10 seconds. Next, the FPCB was placed thereon, and bonding was performed under conditions of 45 MPa, 200° C., and 20 seconds to fabricate a connection structure.

④ Measurement of Initial Connection Resistance

Resistance was measured using the electrode of the FPCB of the connection structure. The resistance was measured using an ADCMT 6871E Digital Multimeter 2probe.

⑤ Reliability Resistance Measurement

Reliability resistance was measured after 100 hours of resting in 85° C. humidity condition.

For resistance measurement, the connection structure that was rested for 100 hours was placed in a drying oven at 100° C. for 24 hours so that residual moisture was removed. After that, the resistance was measured using an ADCMT 6871E Digital Multimeter 2probe, and the measurement result is summarized in Table 3.

The criteria for initial connection resistance are shown below.

OOO: In a range of 2Ω or less
OO: In a range of from more than 2Ω to 3 Ω
O: In a range of from more 3Ω and to 5 Ω
X: In a range of more than 5 Ω

The criteria for increase in connection resistance after reliability test of 100 hours at 85° C. are shown below.

OOO: Increase in a range of 2Ω or less
OO: Increase in a range of from more than 2Ω to 4 Ω
O: Increase in a range of more than 4Ω to 6 Ω
X: Increase in a range of more than 5Ω

TABLE 3

|  | Initial resistance test | Test for increase in connection resistance after 100 hours at 85° C. |
|---|---|---|
| Example 1 | OOO | OO |
| Example 2 | OOO | OO |
| Example 3 | OO | OO |
| Example 4 | OO | OO |

The features, structures, effects, etc. of each of the implementation examples described above may be combined with those of other implementation examples by those skilled in the art so that the illustrated implementation examples may be used in modified forms. Therefore, the contents relating to this combination and modification should be construed to fall within the scope of the present invention.

The invention claimed is:

1. A conductive particle comprising:
    an insulating core; and
    a conductive layer formed on the insulating core and comprising at least two elements,
    wherein a diffraction pattern obtained by analyzing the conductive layer using XRD comprises at least two diffraction rings,
    wherein the conductive layer is a single layer without interlayer boundaries, and an average long axis length of crystal grains of the conductive layer is in a range of 8 nm to 13 nm.

2. The conductive particle of claim 1, wherein the conductive layer comprises Ni and at least two elements selected from the group consisting of B, P, N, Pd, Pt, W, Au, Ag, Mo, and Co.

3. The conductive particle of claim 1, wherein the radius of the innermost diffraction ring of the diffraction rings is 4.93 (1/nm)±0.2 (1/nm).

4. The conductive particle of claim 1, wherein when the conductive layer is divided into a first region adjacent to the insulating core, a second region adjacent to the first region, and a third region that is an outermost region adjacent to the second region, the conductive layer is a single-layered layer with no boundaries between each of the first, second, and third regions.

5. The conductive particle of claim 1, wherein content of the elements in the conductive layer varies from region to region.

6. The conductive particle of claim 2, wherein the conductive layer comprises at least two elements selected from the group consisting of B, P, N, Pd, Pt, W, Au, Ag, Mo, and Co.

7. The conductive particle of claim 1, further comprising an insulating layer or an insulating particle on an outer surface of the conductive layer.

8. The conductive particle of claim 1, wherein an outermost shell on the conductive layer is treated with a hydrophobic anti-corrosion agent.

9. An anisotropic conductive material comprising the conductive particle of claim 1.

10. A connection structure comprising the conductive particle of claim 1.

11. An electronic device comprising the conductive particle of claim 1.

* * * * *